US008847597B2

(12) United States Patent
Rasche et al.

(10) Patent No.: US 8,847,597 B2
(45) Date of Patent: Sep. 30, 2014

(54) MAGNETIC FIELD UNIT OF AN MRT SYSTEM FOR IMAGE CAPTURING A HEAD REGION

(75) Inventors: Volker Rasche, Erbach (DE); Erich Hell, Illingen (DE); Johannes Ulrici, Darmstadt (DE)

(73) Assignee: Sirona Dental Systems GmbH, Bensheim (DE)

( * ) Notice: Subject to any disclaimer, the term of this patent is extended or adjusted under 35 U.S.C. 154(b) by 403 days.

(21) Appl. No.: 13/376,066

(22) PCT Filed: Jun. 23, 2010

(86) PCT No.: PCT/EP2010/058875
§ 371 (c)(1),
(2), (4) Date: Feb. 15, 2012

(87) PCT Pub. No.: WO2010/149686
PCT Pub. Date: Dec. 29, 2010

(65) Prior Publication Data
US 2012/0146645 A1 Jun. 14, 2012

(30) Foreign Application Priority Data

Jun. 23, 2009 (DE) .......................... 10 2009 027 119

(51) Int. Cl.
*G01V 3/00* (2006.01)
*G01R 33/383* (2006.01)
*G01R 33/421* (2006.01)
*G01R 33/3875* (2006.01)
*G01R 33/38* (2006.01)

(52) U.S. Cl.
CPC .......... *G01R 33/383* (2013.01); *G01R 33/3875* (2013.01); *G01R 33/3806* (2013.01); *G01R 33/421* (2013.01)
USPC ........................................................ 324/318

(58) Field of Classification Search
CPC .. G01R 33/307; G01R 33/401; G01R 33/341; G01R 33/3678; G01R 33/3415; G01V 11/00
USPC .................................................. 324/300–322
See application file for complete search history.

(56) References Cited

U.S. PATENT DOCUMENTS 4,878,023 A 10/1989 Overweg et al. .............. 324/318
5,085,219 A 2/1992 Ortendahl et al.
(Continued)

FOREIGN PATENT DOCUMENTS

CN 1 238 463 A 12/1999
CN 1 609 627 A 4/2005
(Continued)

OTHER PUBLICATIONS

Jakob et al., "In Vivo MRI-Based Dental Impression Using an Intraoral RF Receiver Coil", Concepts in Magnetic Resonance Part B, Magnetic Resonance Engineering, vol. 33B(4), pp. 244-251 (2008).

(Continued)

*Primary Examiner* — Dixomara Vargas
(74) *Attorney, Agent, or Firm* — Fitzpatrick, Cella, Harper & Scinto (57) ABSTRACT

A magnetic field unit of an MRT system for image capturing a head region as the region to be recorded, comprising at least one permanent magnet for generating a main magnetic field, a device for generating a gradient field, and at least one coil for generating and receiving radio frequencies. The magnetic field unit is fastened to a mounting such that a longitudinal axis of the magnetic field unit, together with a vertically extending axis, forms an angle of no more than +45 degrees, and the magnetic field unit and the patient can be adjusted relative to each other such that the magnetic field unit can be moved to a position surrounding the head of the patient.

19 Claims, 4 Drawing Sheets

(56) References Cited

U.S. PATENT DOCUMENTS

| | | | |
|---|---|---|---|
| 5,296,811 A | 3/1994 | Ehnholm et al. | |
| 5,382,904 A | 1/1995 | Pissanetzky | 324/319 |
| 5,511,106 A | 4/1996 | Doebert et al. | |
| 6,037,774 A * | 3/2000 | Felmlee et al. | 324/318 |
| 6,157,278 A * | 12/2000 | Katznelson et al. | 335/296 |
| 6,321,108 B2 | 11/2001 | Furuta et al. | 600/422 |
| 6,326,788 B1 * | 12/2001 | Mulder et al. | 324/318 |
| 6,411,187 B1 * | 6/2002 | Rotem et al. | 335/296 |
| 6,806,712 B2 * | 10/2004 | Akgun | 324/318 |
| 6,922,055 B1 * | 7/2005 | Damadian et al. | 324/318 |
| 6,975,117 B1 * | 12/2005 | Damadian et al. | 324/319 |
| 7,034,535 B2 * | 4/2006 | Yamagata | 324/318 |
| 7,102,353 B1 | 9/2006 | Damadian | |
| 7,123,008 B1 * | 10/2006 | Damadian et al. | 324/309 |
| 7,176,688 B2 | 2/2007 | Sato | 324/318 |
| 7,268,553 B1 * | 9/2007 | Damadian et al. | 324/318 |
| 7,323,962 B2 * | 1/2008 | Xia | 335/296 |
| 7,375,521 B1 * | 5/2008 | Damadian et al. | 324/318 |
| 7,701,209 B1 * | 4/2010 | Green | 324/307 |
| 7,728,592 B2 * | 6/2010 | Ma et al. | 324/318 |
| 7,843,196 B2 * | 11/2010 | Teklemariam et al. | 324/319 |
| 7,970,453 B2 * | 6/2011 | Noras | 600/422 |
| 8,160,674 B2 | 4/2012 | Kuth et al. | 600/415 |
| 8,386,011 B2 * | 2/2013 | Wieczorek | 600/407 |

FOREIGN PATENT DOCUMENTS

| | | |
|---|---|---|
| CN | 101 366 630 A | 2/2009 |
| DE | 42 39 048 A1 | 5/1993 |
| DE | 10 2007 038 382 A1 | 2/2009 |
| EP | 0 067 933 A1 | 12/1982 |
| EP | 0 632 994 A1 | 1/1995 |
| EP | 0 654 675 A1 | 5/1995 |
| EP | 1 460 443 A2 | 9/2004 |
| EP | 1 876 462 A1 | 1/2008 |
| GB | 2 319 339 A | 5/1998 |
| JP | 59-61763 A | 4/1984 |
| JP | 63-264051 | 10/1988 |
| JP | 64-70031 | 3/1989 |
| JP | 07-508857 | 9/1995 |
| JP | 63-286142 A | 11/1998 |
| JP | 11-99134 A | 4/1999 |
| JP | 2003-334175 A | 11/2003 |
| JP | 2004-313533 | 11/2004 |
| JP | 2005-185387 | 7/2005 |

OTHER PUBLICATIONS

Swartz et al., "In Vivo EPR for Dosimetry", Radiation Measurements, vol. 42, No. 6-7, Elsevier, Amsterdam, NL, Jul. 2007, pp. 1075-1084.

European Patent Office, Internationaler Recherchenbericht in connection with International Application No. PCT/EP2010/058875, dated Oct. 18, 2010 (6 pages including English translation entitled International Search Report).

European Patent Office, Internationaler vorläufiger Bericht zur Patentfähigkeit in connection with International Application No. PCT/EP2010/058875, dated May 19, 2011 (21 pages including English translation entitled International Preliminary Report on Patentability).

German Patent Office, Office Action in connection with German Application No. 10 2009 027 119.8, dated Jan. 15, 2010 (9 pages, including machine-generated English translation).

Japanese Patent Office, Office Action in connection with Japanese Application No. 2012-516708, dated Jun. 10, 2014, (6 pages, including English translation).

Chinese Patent Office, Office Action in connection with Chinese Application No. 201080028261.4, dated May 6, 2014, (26 pages, including German translation).

* cited by examiner

MAGNETIC FIELD UNIT OF AN MRT SYSTEM FOR IMAGE CAPTURING A HEAD REGION

The present invention relates to a magnetic field unit of an MRT system for acquiring an image of a part of a head forming a region to be scanned, which magnetic field unit comprises at least one permanent magnet, a device for the production of a gradient field, and at least one coil for generating and receiving radio frequencies.

PRIOR ART

Very limited use has hitherto been made of magnetic resonance tomography in the field of dentistry. This is primarily due to the high cost of installation and operation, and the limited dental image information of clinical relevance.

By contrast, X-ray images as can be produced by the device disclosed, for example, in EP 0 632 994 A1 are widely used. In this case, an X-ray diagnostic device for producing X-ray images of body parts, for example a jaw, is disclosed, in which a line detector camera and a radiation source disposed diametrically opposite thereto can be moved synchronously around the object to be scanned.

The advantage of the use of magnetic resonance tomography for image production over classical X-ray technology is that the patient is not required to be exposed to radiation with X-rays.

For example, EP 1876 462 AI discloses a magnetic system for examining samples by means of electron spin resonance, which magnetic system is disposed around a sample area and produces a magnetic field having a variable field strength within the sample area.

The article "In Vivo MRI-Based Dental Impression Using an Intraoral Rf Receiver Coil" by P. M. Jakob, published in Concepts in Magnetic Resonance Part B, Magnetic Resonance Engineering, Vol. 33 B(4) pp. 244 to 251, 2008, discloses a receiver coil for radio frequencies of an MRI system, which receiver coil can be placed in the mouth of a patient and used in a conventional MRT apparatus. Thus the receiver coil can be positioned as close as possible to the object to be scanned, namely the jaw and/or the teeth, and the quality of the image of the jaw region produced by a conventional MRT apparatus can be improved.

It is an object of the invention to provide an economical magnetic field unit in an MRT system, which unit has matched system architecture and makes it possible to use magnetic resonance tomography in a meaningful manner, particularly in the field of dentistry.

SUMMARY OF THE INVENTION

The magnetic field unit of the invention used in an MRT system for acquiring an image of ahead region forming the region to be scanned comprises at least one permanent magnet for the purpose of producing a main magnetic field, a device for the production of a gradient field, and at least one coil for generating and receiving radio frequencies, which magnetic field unit is fixed to a support such that the longitudinal axis of the magnetic field unit forms with an axis extending in the vertical direction an angle of not more than ±45°, and the magnetic field unit and the patient can be moved relatively to each other such that the magnetic field unit can be positioned so as to surround the head of the patient.

The advantage of the vertical alignment of the magnetic field unit of the invention in an MRT system is that the patient can be scanned in a seated or standing position and is not required to lie in a horizontal position. There thus exists the possibility of positioning the patient during the scan on a dentist's chair as is present in all dentists' premises.

Advantageously, the volume delimited, at least partially, by the magnetic field unit has a diameter equal to not more than twice the diameter of a standard head. This ensures that the patient's head can be positioned well within the magnetic field unit, which is designed so as to be as compact as possible. The compactness of the magnetic field unit necessitates the use of the least possible amount of magnetic material, which keeps the costs down and makes the unit as lightweight as possible, thus rendering the magnetic field unit very easy to handle.

Advantageously, the homogeneous region of the main magnetic field produced is at least large enough to cover the lower 15 cm of a standard head positioned in the magnetic field unit. This ensures that the jaw region of a patient can be scanned by means of magnetic resonance tomography.

Advantageously, the permanent magnet has a closed shape in a cross-section taken perpendicularly to its longitudinal axis, and a three-dimensional homogeneous region of the main magnetic field is formed within the volume enclosed by the permanent magnet.

Thus, for example, Halbach geometry may be selected for the permanent magnet. This makes it possible to produce a main magnetic field using a small amount of magnetic material and yielding a correspondingly low weight of the device. The closed geometry further ensures that the stray field of the main magnetic field is kept small.

Advantageously, the closed shape of the permanent magnet is longer than it is broad. Thus a homogeneous region is produced that likewise has an elongated shape, as a result of which it can be made to overlap the jaw region of the patient, and the overall dimensions of the permanent magnet and thus also the amount of magnetic material used can be kept at a minimum. Thus it is possible not only to save costs and space, but also to simplify the movement of the magnetic field unit by virtue of the low weight of the device.

Advantageously, the closed shape of the permanent magnet is aligned so as to surround the patient such that the vertical axis of the patient, that is to say, the axis extending through the centroid of the Frankfurt horizontal plane, is located at a distance from the centroid of the cut plane, taken perpendicularly to the longitudinal axis, of the homogeneous region of the main magnetic field.

Since the region to be scanned, namely the jaw region of a patient, is located at a distance from the vertical axis of the patient, maximum overlap of the homogeneous region of the magnetic field over the jaw region is achieved.

Advantageously, the centroid of the cut plane, taken perpendicularly to the longitudinal axis of the homogeneous region, of the main magnetic field coincides with the centroid of the cut plane, taken perpendicularly to the longitudinal axis, of the volume enclosed by the permanent magnet.

Thus a very simple geometric shape of the permanent magnet can be used, for example an ellipsoid having a wall thickness that is centrosymmetrical about the centroid of the area enclosed by the permanent magnet. This also requires less magnetic material, as a result of which the device is more economical to produce and is lighter in weight.

Advantageously, the closed shape is disposed so as to surround the patient such that the vertical axis of the patient is located at a distance from the centroid of the cut plane of the volume enclosed by the permanent magnet taken perpendicularly to the longitudinal axis.

Thus it is possible to achieve maximum overlap of the homogeneous region of the magnetic field located around the centroid of a cut plane of the enclosed volume over the patient's jaw region to be scanned.

Advantageously, the centroid of the cut plane, taken perpendicularly to the longitudinal axis, of the homogeneous region of the main magnetic field is located at a distance from the centroid of the cut plane, taken perpendicularly to the longitudinal axis, of the volume enclosed by the permanent magnet.

This makes it possible to position the patient centrally within the closed shape of the permanent magnet and yet achieve a large overlap of the homogeneous region over the patient's jaw region to be scanned.

Advantageously, the closed shape is disposed so as to surround the patient such that the vertical axis of the patient coincides with the location of the centroid of the cut plane, taken perpendicularly to the longitudinal axis, of the volume enclosed by the permanent magnet or is close thereto, so that the region to be scanned located at a distance from the vertical axis of the patient coincides with the location of the homogeneous region of the main magnetic field.

The central position of the patient makes it possible to keep the dimensions of the permanent magnet as small as possible, by means of which lower costs and reduced weight of the device can be achieved.

On the whole, it is important that the region to be scanned be capable of being positioned as far as possible completely within the homogeneous region of the main magnetic field. As a result, it is necessary to position the patient accordingly relatively to the homogeneous region of the main magnetic field, and also, depending on the position of the main magnetic field within the magnetic field unit, to position the patient relatively to the magnetic field unit.

The patient's jaw region to be scanned is that region of the patient's head which is located at a distance from the vertical axis of the patient. If the patient is positioned such that the jaw area is located as far as possible completely in the homogeneous region of the main magnetic field, then the vertical axis of the patient will always be located at a distance from the centroid of an area extending perpendicularly to the longitudinal axis of the magnetic field unit. Depending on whether the homogeneous region of the main magnetic field is positioned at the center, or rather at the edge, of the magnetic field unit, the patient must be moved toward the center of the magnetic field unit. That is to say, the vertical axis of the patient must be positioned at a distance from the longitudinal axis of the magnetic field unit or exactly at the center of the magnetic field unit.

Advantageously, the magnetic field unit can be tilted about a horizontal axis in relation to the support by means of a hinged joint.

In this way, the patient's jaw region to be scanned can be made to overlap the homogeneous region of the magnetic field of the permanent magnet more easily.

Advantageously, there are provided at least two permanent magnets for the production of the main magnetic field, which two permanent magnets are connected to each other by a yoke and are disposed around the region to be scanned.

This design variant that is open on one side enables the patient to be positioned easily, and he or she has a clear field of vision during the scan, if desired. Furthermore, a larger homogeneous region of the magnetic field and thus a larger scannable region can thus be produced.

Advantageously, the magnetic field unit comprises an apparatus for restraining the head of a patient, and/or a bite block. Such an apparatus can comprise, for example, a forehead rest and/or earpieces, and prevents movement of the patient in the region to be scanned during the scan. The bite block also provides a possible way of preventing or at least restricting such movement.

Advantageously, the device for the production of a gradient field and/or the coil for generating and/or receiving radio frequencies is mounted on the restraining apparatus.

The advantage of mounting the device for the production of a gradient field on the restraining apparatus is that the former is immovably connected to the region to be scanned during the scan. That is to say, the device for the production of a gradient field and the region to be scanned move together, which increases the accuracy of the spatial resolution. Due to the fact that a coil for receiving radio frequencies is provided on the restraining apparatus, this coil will be located very close to the object to be scanned during the scan, as a result of which the signal-to-noise ratio of the measuring signals is increased. If the coil for receiving radio frequencies is also used for transmission purposes, it is possible to economize on an additional coil for transmitting radio frequencies.

Advantageously, there is provided at least one coil for receiving radio frequencies, which coil can be placed in the mouth of the patient.

Thus the coil for receiving radio frequencies is located as close as possible to the object to be scanned, namely the jaw region of a patient, which increases the quality of the measuring signals.

Advantageously, the magnetic field unit comprises a movable shielding device that can surround the magnetic field unit and the patient positioned therein such that only a minimum of radio frequencies from the environment can enter the region inside the shielding device. This increases the quality of the measuring signals.

Advantageously, the magnetic field unit comprises a compensating coil system for compensating interferences in the main magnetic field. Thus, for example, interferences in the main magnetic field, which may be produced by the patient his or herself, can also be compensated. For example, it may also be necessary to accept restrictions regarding the homogeneity of the main magnetic field produced by the magnetic field unit for reasons of cost or for structural reasons and to effect compensation by means of the compensating coil system.

Advantageously, the magnetic field unit is mounted on a stand so as to be vertically adjustable.

As a result, the permanent magnet can be moved so as to surround a patient seated or standing below the magnetic field unit. Furthermore, the vertical position of the magnetic field unit can be selected to suit the height of the patient.

BRIEF DESCRIPTION OF THE DRAWINGS

Several exemplary embodiments of the invention are illustrated in the drawings, in which.

DETAILED DESCRIPTION OF THE EXEMPLARY EMBODIMENTS

Figure 1:
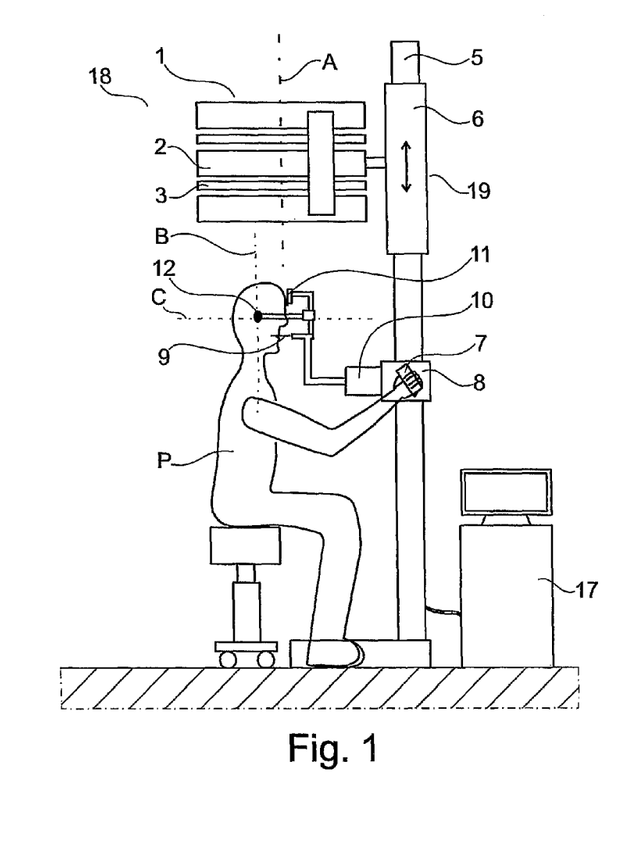
FIG. 1 shows a magnetic field unit.

FIG. 1 is a side view of an MRT system 18 comprising a magnetic field unit 1 of the invention and a control unit 17.

Figure 2A:
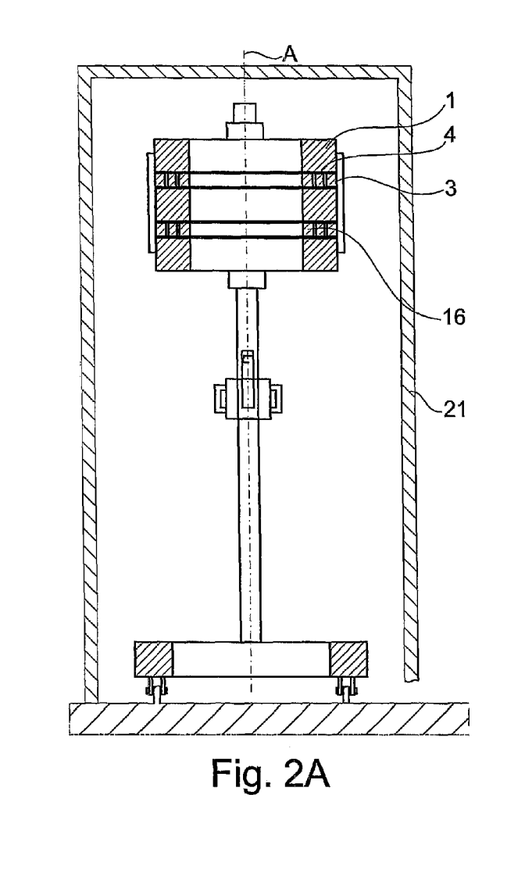
FIGS. 2A and 2B are cross-sectional views of the magnetic field unit shown in FIG. 1.
Figure 2B:
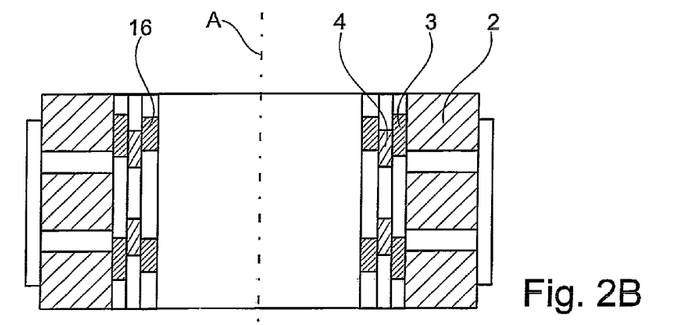

The magnetic field unit 1 comprises a plurality of permanent magnets 2 having a closed shape for the production of a main magnetic field and a device 3 consisting of a plurality of coils for the production of a gradient field, and coils 4 for generating and receiving radio frequencies. An example of an arrangement of the device 3 for the production of generating a gradient field and the coil 4 for generating and receiving radio frequencies is shown in FIG. 2A, which is a cross-sectional view of the magnetic field unit 1. The coils of the device 3 for the production of a gradient field and the at least one coil 4 for generating and receiving radio frequencies are disposed in the space between the plurality of permanent magnets 2. The device 3 for the production of a gradient field and the at least one coil 4 for generating and receiving radio frequencies could also be disposed on a cylinder or they could each be integrated into a cylindrical layer and be disposed on the inwardly oriented surfaces of the permanent magnets 2. FIG. 2B is a sketch of such an arrangement of the coils within several permanent magnets 2 having a closed shape.

In order to compensate for interference in the main magnetic field, there can also be provided a compensating coil system 16 that can consist, for example, of a coil, which is likewise disposed on a cylinder inside the permanent magnet, as shown in FIG. 2B, or which can be disposed in the gap between individual permanent magnets 2, as shown in FIG. 2A.

In order to prevent interference from reaching the system from the environment, there can be provided a shielding device 21, as shown in FIG. 2A, which completely encloses the magnetic field unit 1 and the patient positioned in the interior thereof and shields this interior from electromagnetic radiation present in the environment.

The magnetic field unit 1 is mounted on a holding device 19 in the form of a stand 5 such that it is displaceable in the vertical direction via a guide 6. The stand 5 can either be fixed permanently to the floor, as shown in FIG. 1, or it can comprise rollers, as shown in FIG. 2, so that the magnetic field unit 1 can be moved readily.

Another possible way of mounting the magnetic field unit 1 would be to fix the same to a holding device 19 on a wall so as to be vertically displaceable, for example, via a guide rail.

The capability of the magnetic field unit 1 to move in the vertical direction makes it possible to position a patient P in front of the stand 5 in a seated or standing position before the magnetic field unit 1 is moved downwardly so as to surround the head of the patient P. Furthermore, the position of the magnetic field unit 1 in the vertical direction can be adjusted to suit the height of the patient P. The longitudinal axis A of the magnetic field unit 1 is oriented in the vertical direction as is the case with the vertical axis B of the patient P, the latter axis denoting the axis that extends perpendicularly to the Frankfurt horizontal plane C and passes through the centroid thereof.

A chair may be provided for the purpose of positioning the patient P. Furthermore, handles 7 can be provided which the patient P can grasp with his or her hands during the scan. The handles 7 can be fixed to the stand 5 so as to be displaceable in the vertical direction, for example, via a guide 8 such that their vertical position can be adjusted to suit the height of the patient P.

Furthermore, a bite block 9 may be provided for positioning purposes. For example, the bite block 9 can likewise be fixed to the guide 8 so as to adjust its vertical position to suit the patient P. A guide 10 may be provided in the horizontal direction in order to make the distance of the patient P from the stand 5 adjustable, as is the position of the vertical axis B of the patient P in relation to the position of the longitudinal axis A of the magnetic field unit 1.

Figure 3A:
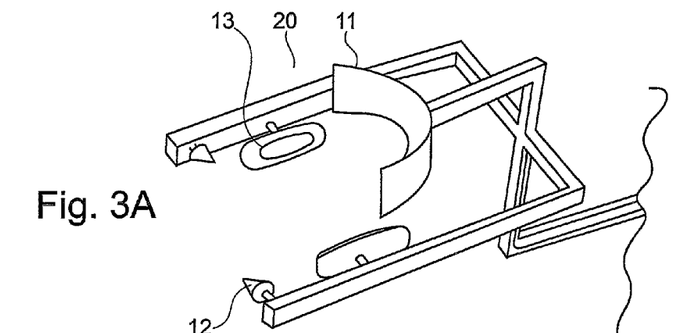
FIG. 3 shows an apparatus for restraining a patient inside the magnetic field unit shown in FIG. 1.
Figure 3B:
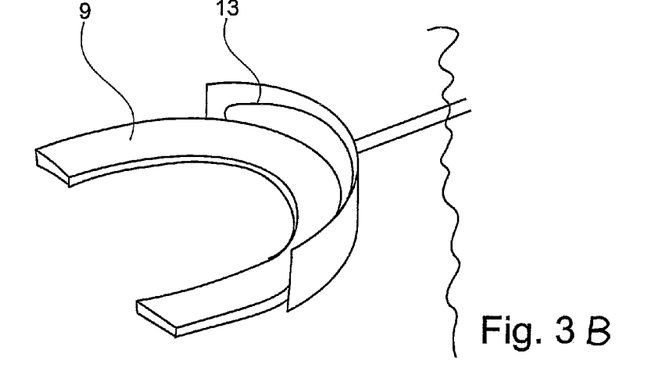

Furthermore, there can be provided an apparatus 20 for restraining the patient P, which apparatus 20 comprises, for example, a forehead rest 11 and/or earpieces 12 and is likewise attached to the guide 8. A diagram illustrates an appropriate apparatus 20 for restraining the patient P is provided in FIG. 3. It is also possible to place components of the magnetic field unit 1 on the restraining apparatus 20 which include the device 3 for the production of a gradient field or the coil 4 for generating and receiving radio frequencies or alternatively merely a receiver coil 13. As shown in FIG. 3, receiver coils 13 in the form of flat surface coils, for example, could be disposed on the restraining apparatus 20 such that the receiver coils are located on each side of, and very close to, the scannable jaw K of the positioned patient P. This can increase the quality of the measuring signal.

In order to increase the sensitivity of the receiver coil 13, the same can be disposed on the bite block 9 so that it is located as close as possible to the object to be scanned, namely the jaw K of the patient P, during the scanning process. It may also be advantageous to mount the device 3 for the production of a gradient field on the bite block 9, since the device 3, which is in the form of coils, for example, will then be immovably disposed in relation to the object to be scanned, namely the jaw K. That is to say, the object to be scanned and the device 3 move identically, so that errors or inaccuracies occurring in spatial resolution of the scan are avoided, as would result from movement of the object to be scanned in relation to the gradient field.

Figure 4A:
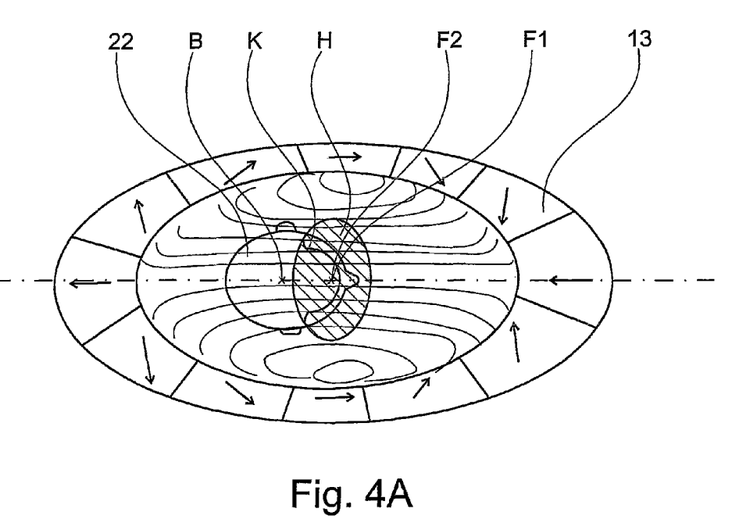
FIG. 4 shows a permanent magnet of the magnetic field unit shown in FIG. 1.

The shape of the permanent magnet 2 of the magnetic field unit 1 shown in FIGS. 1 and 2 can, for example, take the form of a Halbach geometry, as shown in FIG. 4A, in which the inside lines indicate the distribution of the magnetic field.

Due to the elongated shape of the permanent magnet 2, it is not possible to position a patient P centrally, but the patient P can instead be positioned such that there exists a gap between the vertical axis B of the patient P and a centroid F2 of the plane enclosed by the permanent magnet 2. It is thus possible to use a simple geometry for the permanent magnet 2 without any need to make the permanent magnet 2 unduly large. A further advantage gained is that the region to be scanned, namely the jaw K of the patient P, is located in the region of the centroid of the plane enclosed by the permanent magnet 2 and thus also in the homogeneous region H of the main magnetic field.

The external dimensions of the permanent magnet 2 primarily aim at achieving a very compact design and at the same time at satisfying the requirement of ensuring that the volume delimited by the permanent magnet is sufficiently large to scan a standard head and that the homogeneous region H produced extends at least over the jaw region to be scanned.

Figure 4B:
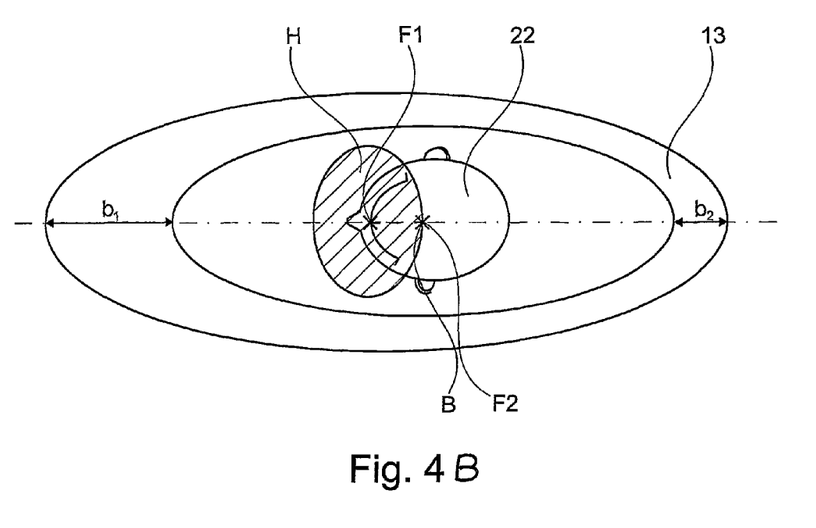

A further design variant of one or more permanent magnets 2 is shown in FIG. 4B. In this case, the shape of the permanent magnet 13 is likewise elongated, but the thickness b1, b2 of the permanent magnet 13 has different values at the two furthermost points of the elliptical form (b1>b2). Thus a homogeneous magnetic field is formed in the area enclosed by the permanent magnet 13, and the centroid F1 of the homogeneous magnetic field is located at a distance from the centroid F2 of the area enclosed by the permanent magnet. Thus it is possible to position a patient P centrally within the permanent magnets 13 so that the vertical axis B of the patient P passes through the centroid F2 of the area enclosed by the permanent magnet 13 or is at least very close thereto, and at the same time local alignment is achieved between the object to be scanned, namely the jaw K, and the homogeneous region H of the magnetic field of the permanent magnets 13.

Figures 5, 6A, 6B:
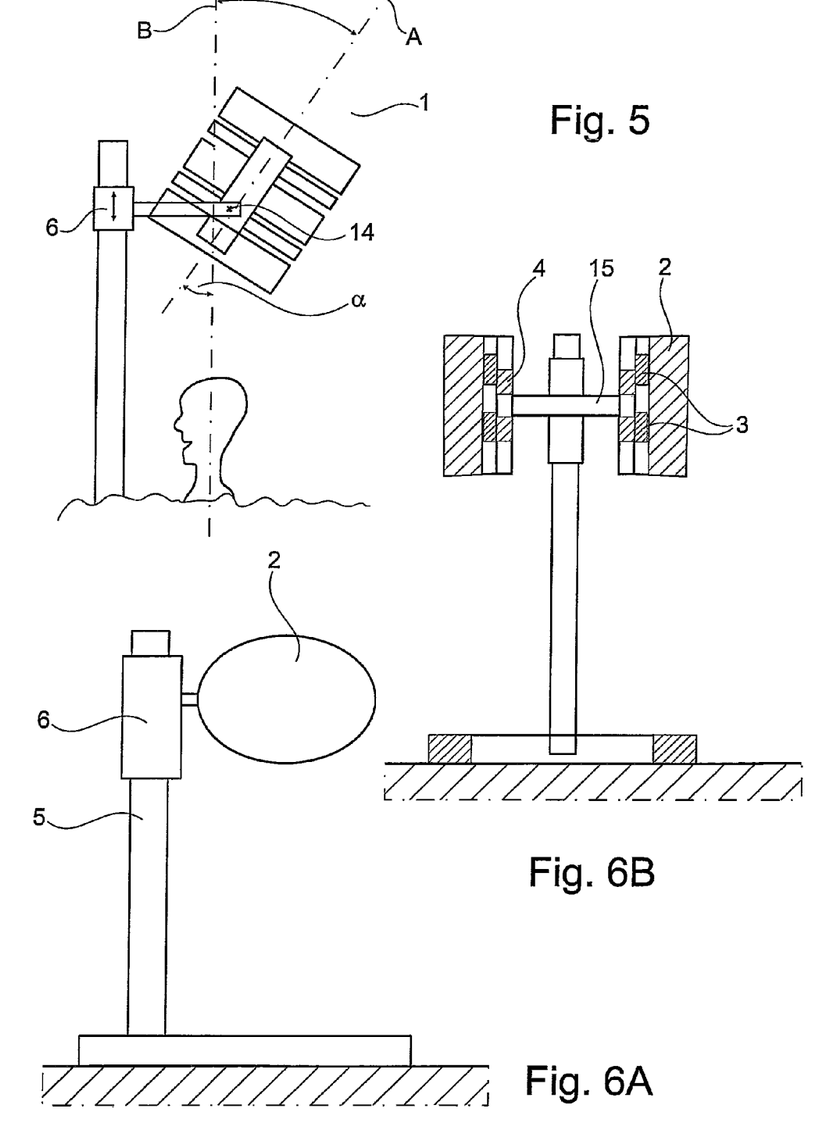
FIG. 5 shows the magnetic field unit shown in FIG. 1 provided with a hinged joint.
FIGS. 6A and 6B show a further embodiment of a magnetic field unit of the invention.

A further exemplary embodiment of the magnetic field unit 1 shown in FIGS. 1 and 2 comprising a closed permanent magnet 2 is shown in FIG. 5. There is provided a hinged joint 14 between the guide 6 and the magnetic field unit 1, and the axis of the hinged joint extends in the horizontal direction and perpendicularly to the image plane. Thus the magnetic field unit 1, that is to say, its longitudinal axis A can be tilted relatively to the vertical axis B of the patient P by an angle α of up to 45°. This can allow the homogeneous region H of the main magnetic field of the permanent magnet 2 to more effectively overlap the region to be scanned, namely the jaw K of the patient P.

As shown in the side and front views of FIGS. 6A and 6B respectively, the permanent magnets 2 can alternatively be plate-like and can be interconnected by means of a yoke 15, the patient P being positioned between the two plate-like permanent magnets 2. In this design variant, the device 3 for the production of a gradient field and the coil 4 for transmitting and/or receiving radio frequencies can be integrated, for example, in the form of flat coils disposed in layers on those surfaces of the permanent magnets that face each other.

It would likewise be possible to permanently fix the magnetic field unit 1 to the stand 5 or to the support 19 on the wall and to move the patient P into the magnetic field unit 1, for example, by means of a chair that can be displaced in the vertical direction.

LIST OF REFERENCE SIGNS 1 magnetic field unit
2 permanent magnet
3 device for the production of a gradient field
4 coil for generating and receiving radio frequencies
5 stand
6 vertical guide
7 handle
8 vertical guide
9 bite block
10 horizontal guide
11 forehead support
12 earpieces
13 receiver coil
14 hinged joint
15 yoke
16 compensating coil system
17 control unit
18 MRT system
19 holding device
20 restraining device
21 shielding device
22 standard head
A longitudinal axis of the magnetic field unit 1
α angle
B vertical axis of the patient P
C Frankfurt horizontal plane
F1 centroid of the homogeneous region H
F2 centroid of the plane enclosed by the permanent magnet 2
H homogeneous region of the main magnetic field
K jaw of the patient. P
P patient

The invention claimed is:

1. A magnetic field unit of a magnetic resonance tomography (MRT) system for acquiring an image of a head region forming a region to be scanned, comprising:

a plurality of axially spaced permanent magnets having a closed shape, for production of a main magnetic field;
a device, including a plurality of coils, for production of a gradient field; and
at least one coil for generating and receiving radio frequencies,
wherein the magnetic field unit is attached to a holding device in such a manner that a longitudinal axis of the magnetic field unit encloses with a vertical axis an angle of not more than ±45 degrees such that the longitudinal axis of the magnetic field unit and a vertical axis of a seated or standing patient enclose an angle of not more than 40 degrees,
wherein the magnetic field unit and the patient can be moved relatively to each other such that the magnetic field unit can be positioned around the head of the patient, and
wherein the plurality of coils in the device for the production of a gradient field and the at least one coil for generating and receiving radio frequencies are disposed in one or more gaps between the plurality of axially spaced permanent magnets.

2. The magnetic field unit as defined in claim 1, wherein a volume at least partially delimited by the magnetic field unit has a diameter equal to not more than twice a diameter of a standard head.

3. The magnetic field unit as defined in claim 1, wherein a homogeneous region of the main magnetic field produced is at least sufficiently large to cover a lower 15 cm of a standard head positioned in the magnetic field unit.

4. The magnetic field unit as defined in claim 1, wherein each of the plurality of permanent magnets has a closed shape in a cross-section taken perpendicularly to its longitudinal axis and within a volume enclosed by the plurality of permanent magnets there is formed a three-dimensional homogeneous region of the main magnetic field.

5. The magnetic field unit as defined in claim 4, wherein the closed shape is longer than it is broad.

6. The magnetic field unit as defined in claim 4, wherein the closed shape is positioned around the patient such that the vertical axis of the patient, defined by the axis passing through a centroid of a Frankfurt horizontal plane, is set at a distance from a centroid of a cut plane, taken perpendicular to a longitudinal axis of the homogeneous region of the main magnetic field.

7. The magnetic field unit as defined in claim 4, wherein a centroid of a cut plane, taken perpendicularly to the longitudinal axis of the homogeneous region of the main magnetic field, coincides with a centroid of a cut plane, taken perpendicularly to the longitudinal axis of the volume enclosed by the plurality of permanent magnets.

8. The magnetic field unit as defined in claim 4, wherein the closed shape is positioned around the patient such that the vertical axis of the patient is set at a distance from a centroid of a cut plane, taken perpendicularly to a longitudinal axis of the volume enclosed by the plurality of permanent magnets.

9. The magnetic field unit as defined in claim 4, wherein a centroid of a cut plane, taken perpendicularly to the longitudinal axis, of the homogeneous region of the main magnetic field is set at a distance from a centroid of a cut plane, taken perpendicularly to the longitudinal axis of the volume enclosed by the plurality of permanent magnets.

10. The magnetic field unit as defined in claim 9, wherein the closed shape is positioned around the patient such that the vertical axis of the patient coincides with a position of a centroid of a cut plane, taken perpendicularly to the longitudinal axis, of the volume enclosed by the plurality of permanent magnets, or is close thereto, such that the region to be scanned which is at a distance from the vertical axis of the patient coincides with a position of the homogeneous region of the main magnetic field.

11. The magnetic field unit as defined in claim 1, wherein the magnetic field unit can be tilted, by means of a hinged joint, relatively to the holding device about a horizontal axis.

12. The magnetic field unit as defined in claim 1, wherein the plurality of permanent magnets are interconnected via a yoke and are disposed around the region to be scanned.

13. The magnetic field unit as defined in claim 1, wherein the magnetic field unit further includes at least one of a device for restraining the head of the patient and a bite block.

14. The magnetic field unit as defined in claim 13, wherein at least one of the device for the production of a gradient field and the coil for generating and receiving radio frequencies are mounted on the restraining device.

15. The magnetic field unit as defined in claim 1, wherein at least one coil for receiving radio frequencies is capable of being placed in the mouth of the patient.

16. The magnetic field unit as defined in claim 1, wherein the magnetic field unit includes a mobile shielding device which is capable of being placed around the magnetic field unit and around the patient being treated by means of the magnetic field unit and such that a minimum of electromagnetic radiation can reach a region within the shielding device from an environment.

17. The magnetic field unit as defined in claim 1, wherein the magnetic field unit further includes a compensating coil system for compensation of interference in the main magnetic field.

18. The magnetic field unit as defined in claim 1, wherein the magnetic field unit is mounted for vertical displacement on a stand.

19. A magnetic field unit of a magnetic resonance tomography (MRT) system for acquiring an image of a head region forming a region to be scanned, comprising:

at least one permanent magnet for production of a main magnetic field;

a device for production of a gradient field; and at least one coil for generating and receiving radio frequencies, wherein the magnetic field unit is mounted on a holding device mounted on a stand for vertical displacement via a guide, wherein a longitudinal axis of the magnetic field unit encloses with a vertical axis an angle of not more than ±45 degrees, such that the longitudinal axis of the magnetic field unit and a vertical axis of a seated or standing patient enclose an angle of not more than 40 degrees, wherein the magnetic field unit and the patient can be moved relatively to each other, and the magnetic field unit can be moved down so as to be positioned around the head of the patient, and wherein a vertical guide is mounted on the stand for vertical displacement, and handles and a bite block capable of horizontal displacement via a horizontal guide and a restraining device are attached to the vertical guide.

* * * * *